United States Patent [19]

Häusler

[11] Patent Number: 5,215,638

[45] Date of Patent: Jun. 1, 1993

[54] ROTATING MAGNETRON CATHODE AND METHOD FOR THE USE THEREOF

[75] Inventor: Alfons Häusler, Obertshausen, Fed. Rep. of Germany

[73] Assignee: Leybold Aktiengesellschaft, Hanau, Fed. Rep. of Germany

[21] Appl. No.: 786,756

[22] Filed: Nov. 1, 1991

[30] Foreign Application Priority Data

Aug. 8, 1991 [DE] Fed. Rep. of Germany ....... 4126236

[51] Int. Cl.⁵ .............................................. C23C 14/35
[52] U.S. Cl. ..................... 204/192.12; 204/298.11; 204/298.22; 204/298.23
[58] Field of Search ..................... 204/192.12, 298.11, 204/298.22, 298.23, 298.26

[56] References Cited

U.S. PATENT DOCUMENTS 4,417,968 11/1983 McKelvey ...................... 204/192.12
4,434,037 2/1984 Crank ............................. 204/192.12

Primary Examiner—Aaron Weisstuch
Attorney, Agent, or Firm—Felfe & Lynch

[57] ABSTRACT

Tubular target (1) has a magnet system (2) provided in the cavity (H) formed by the target (1) for the formation of a first plasma (6) for the coating of planar substrates (4) which are movable past the cathode (3), by means of a cathode sputtering process. A second plasma (9) is produced by a second magnet system (7) in the cavity (H) in an area between the cathode (3) and a plate (10) opposite the substrate (4).

7 Claims, 1 Drawing Sheet

PRIOR ART

ROTATING MAGNETRON CATHODE AND METHOD FOR THE USE THEREOF

BACKGROUND OF THE INVENTION

The invention relates to a rotating magnetron cathode and to a method for the use of a rotating magnetron cathode with a substantially hollow cylindrical target and a magnet system which is provided in the cavity formed by the target, for the formation of a plasma for coating planar substrates which can be moved past the cathode, by means of a cathode sputtering process.

An apparatus and method are known (U.S. Pat. No. 4,356,073) which are suitable for sputtering thin coatings on substantially planar substrates, having an evacuable chamber, a cathode including a tubular cylindrical component containing the coating material to be sputtered, magnets, means for rotating the tubular component, and means for holding and transporting the substrates in the chamber.

In the sputtering of reactive material, before the actual coating process begins, first the undesired coating on the surface of the target to be sputtered is removed. This is performed, as is generally known, by strip-sputtering wherein the material thus sputtered is applied to a plate which is provided approximately in the plane of the substrate that is to be coated. Not until the undesired coating—an oxide coating for example—is removed is the substrate brought into the coating zone and the coating process begun.

In the case of highly reactive materials there are the disadvantages that, through a permanent reaction, such as the oxidation of the target material, no satisfactory sputtering rate can be achieved, and that the sputtering process is disturbed or interrupted by arcs forming on the target surface.

SUMMARY OF THE INVENTION

It is the purpose of the present invention to prevent these above-mentioned influences, so that an arc-free sputtering process at high sputtering rates is possible.

This purpose is achieved by means of a second magnet system provided in a cavity formed by the target, whereby a second plasma is producible in an area between the cathode and a plate, the plate being disposed on the side of the magnetron cathode that lies opposite the substrate.

This rotating magnetron cathode and its method of use advantageously permits the continuous strip-sputtering of the target and thus permits the permanent elimination of any coating from the target surface.

It is furthermore advantageous that the existing sputtering power supply can also be used to supply the strip-sputtering process, and that the intensity of the second plasma varies and can be adjusted as follows:

by the distance of the second magnet system from the target,
by the use of permanent magnets of different strengths, and
by the stream of the sputtering gas (such as Ar, for example).

DETAILED DESCRIPTION OF THE PREFERRED EMBODIMENT

Figure 1:
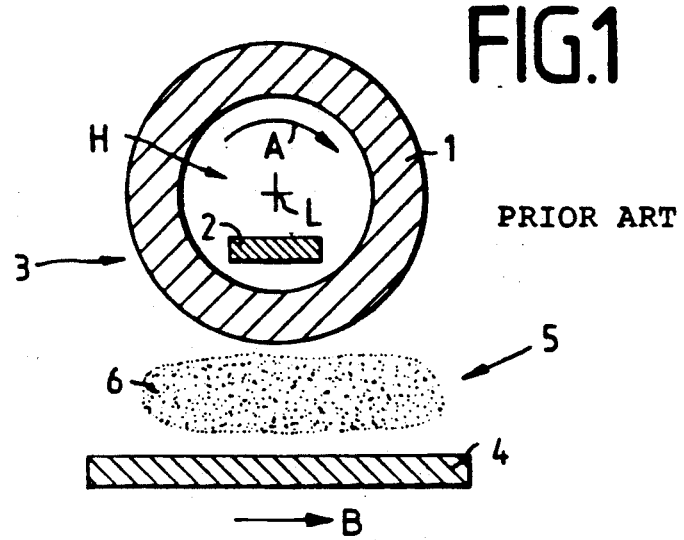
FIG. 1 is a cross-sectional view of a cylindrical, rotating magnetron cathode according to the prior art.

A hollow cylindrical target 1 (FIG. 1) rotates in direction A about its longitudinal axis L. In the cavity H of the target 1 a fixed magnet 2 is provided. Both parts 1 and 2 together form a magnetron 3. The substrate 4 that is to be coated moves in direction B under this magnetron.

A plasma 6 can be established between magnetron 3 and substrate 4 by feeding a sputtering gas 5.

Figure 2:
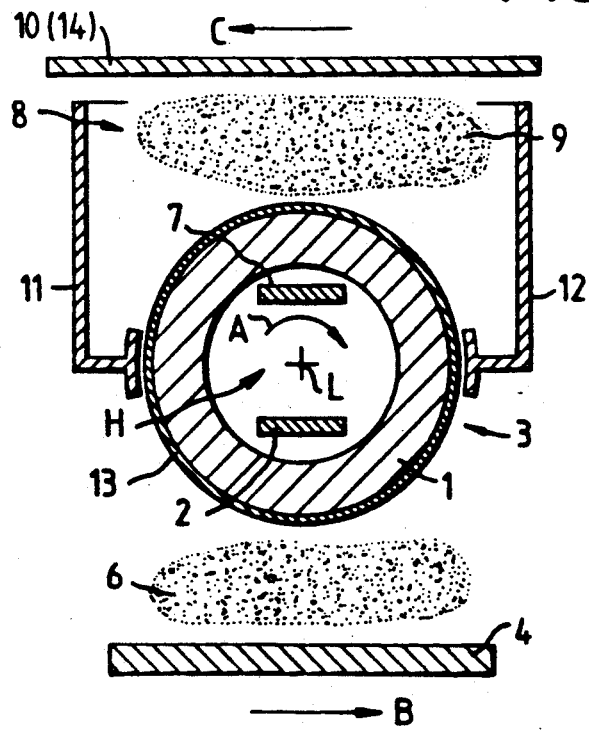
FIG. 2 is a cross-sectional view of a cylindrical, rotating magnetron cathode with a system according to the invention for the production of a second plasma.

In FIG. 2 is shown the same arrangement as in FIG. 1, consisting of magnetron 3, substrate 4 and plasma 6, but with the following additions: in the cavity H of the target 1 there is additionally provided a second magnet 7. With the delivery of a sputtering gas 8, the second magnet 7 permits the formation of a second plasma 9, while magnet 7 and plasma 9 are arranged in a mirror-image symmetry to magnet 2 and plasma 6 about the longitudinal axis L of the magnetron 3. Above the plasma 9, and thus on the side of magnetron 3 opposite the substrate, is a flat plate 10. Under this plate two shielding plates 11 and 12 adjoin laterally of the magnetron 3, enclosing the entire space around the plasma 9.

The operation is as follows. In contrast to the sputtering technology known heretofore in the case of a rotating magnetron cathode 3 with a plasma 6, a second plasma 9 is now used, which is arranged opposite the first plasma 6.

To prime the target 1, i.e., to remove a coating 13 from the surface of the target 1, first the material 13 is sputtered on the plate 10 by means of the plasma 9. After the coating 13 has been completely removed from the target 1, the target material is deposited on the substrate 4 by means of plasma 6.

In order now to prevent any recoating of the target surface during the sputtering process with a new layer, the process of strip-sputtering is continued constantly by means of the second plasma 9.

It is also conceivable to perform a second coating process simultaneously with the first instead of strip sputtering the target with the second plasma 9. For this purpose the plate 10 is replaced by a second substrate 14 which is moved along in direction C over the cathode 3.

I claim:

1. Rotating magnetron cathode comprising
   a tubular target having a cavity therein and a central axis about which the target can be rotated,
   a first magnet system in said cavity between said axis and said target for forming a first plasma outside of said target adjacent said first magnet system for coating a first substrate,
   a second magnet system in said cavity opposite said axis from said first magnet system for forming a second plasma outside of said target adjacent said second magnet system for coating a second substrate, and
   lateral shielding means which cooperates with said target and said second substrate to confine said second plasma.

2. Rotating magnetron cathode as in claim 1 wherein the target is formed of a reactive material.

3. Rotating magnetron cathode as in claim 1 wherein the first and second magnet systems each have a principal length parallel to the longitudinal axis of the target and on radially opposite sides of the cavity.

4. Rotating magnetron cathode as in claim 1 further comprising
   first sputtering gas supply means for supplying a first sputtering gas to said first plasma, and
   second sputtering gas supply means for supplying a second sputtering gas to said second plasma.

5. Method of using a rotating magnetron cathode, comprising
   providing a tubular target having a cavity therein and a central axis about which the target can be rotated,
   forming a first plasma outside of said target by means of a first magnet system in said cavity between said axis and said target,
   forming a second plasma outside of said target opposite from said first plasma by means of a second magnet system in said cavity opposite said axis from said first magnet system, and
   providing lateral shielding means which cooperates with said target to confine said second plasma so that said second plasma can only communicate with said target axially opposite from said first plasma.

6. Method for using rotating magnetron cathode as in claim 5 further comprising performing first and second sputtering processes simultaneously and continuously by means of said first and second plasmas.

7. Method as in claim 5 further comprising
   moving a plurality of first substrates past said first plasma in a first direction, and
   moving a plurality of second substrates past said second plasma in a second direction parallel to said first direction.

* * * * *